United States Patent [19]

Glaise et al.

[11] Patent Number: 5,539,756
[45] Date of Patent: Jul. 23, 1996

[54] METHOD TO ENSURE DATA INTEGRITY IN A TELECOMMUNICATIONS NETWORK

[75] Inventors: Rene Glaise; Xavier Jacquart, both of Nice, France

[73] Assignee: International Business Machines Corporation, Armonk, N.Y.

[21] Appl. No.: 205,677

[22] Filed: Mar. 3, 1994

[30]     Foreign Application Priority Data

Mar. 3, 1993 [EP] European Pat. Off. .............. 93480018

[51] Int. Cl.⁶ .............................. G06F 11/10; G06F 7/00; G06F 15/00; H03M 13/00
[52] U.S. Cl. ........................................ 371/37.1; 364/746.1
[58] Field of Search ................................... 371/37.1, 37.7, 371/38.1, 39.1, 49.2, 53, 54; 364/746.1

[56]             References Cited

U.S. PATENT DOCUMENTS

| 4,720,830 | 1/1988 | Joshi et al. | 371/37.1 |
| 5,062,111 | 10/1991 | Gotou et al. | 371/37.1 |

FOREIGN PATENT DOCUMENTS 0226353  11/1986  European Pat. Off. ....... H03M 13/00

OTHER PUBLICATIONS

IBM Tech. Disc. Bulletin, vol. 30, No. 12, May 1988, New York, US, pp. 458–464 "Method to Proivde Software Calculation of a 32–Bit Frame Check Sequence, A Byte at a Time", p. 462, line 12–p. 464, line 36.

IEEE MIcro, vol. 3, No. 3, Jun. 1983, New York, US. pp. 40–50, by A. Perez: "Byte–Wise CRC Calculations" Abstract, p. 44, right column line 6–p. 45, right column, line 5.

Primary Examiner—Roy N. Envall, Jr.
Assistant Examiner—Emmanuel L. Moise
Attorney, Agent, or Firm—John J. Timar

[57]             ABSTRACT

A method and an apparatus for calculating and checking the Frame Check Sequence (FCS) of a message comprising a sequence of data bytes. A Cyclic Redundancy Code (CRC) is used to generate the FCS at one end and check the message at the other end. For each new byte of the sequence of data bytes, the current FCS, which is a vector of the Galois Field is multiplied by $\alpha^8$, another vector of the Galois Field.

8 Claims, 6 Drawing Sheets

| Power of α | 32 bit vector (MSB on the left) | |
|---|---|---|
| 4294967287 | 1.1.1..111.1..11111..11.1.1..11. | |
| 4294967288 | .1.1.111.11..11.11.1....11111.11 | |
| 4294967289 | 1.1.111.11..11.11.1....11111.11. | |
| 4294967290 | .1.11..1.1.11.1..1.1111..1.11.11 | |
| 4294967291 | 1.11..1.1.11.1..1.1111..1.11.11. | |
| 4294967292 | .11....11.1.1....11..1..11.11.11 | |
| 4294967293 | 11....11.1.1....11..1...11.11.11. | |
| 4294967294 | 1.....1..11.....1...111.11.11.11 | $2^{32}-1th$ |
| 0 | ...............................1 | First |
| 1 | ..............................1. | |
| 2 | .............................1.. | |
| 3 | ............................1... | |
| 4 | ...........................1.... | |
| 5 | ..........................1..... | |
| 6 | .........................1...... | |
| 7 | ........................1....... | |
| 8 | .......................1........ | $\alpha^8$ |
| 9 | ......................1......... | |
| 10 | .....................1.......... | |
| 11 | ....................1........... | |
| 12 | ...................1............ | |
| 13 | ..................1............. | |
| 14 | .................1.............. | |
| 15 | ................1............... | |
| 16 | ...............1................ | |
| 17 | ..............1................. | |
| 18 | .............1.................. | |
| 19 | ............1................... | |
| 20 | ...........1.................... | |
| 21 | ..........1..................... | |
| 22 | .........1...................... | |
| 23 | ........1....................... | |
| 24 | .......1........................ | |
| 25 | ......1......................... | |
| 26 | .....1.......................... | |
| 27 | ....1........................... | |
| 28 | ...1............................ | |
| 29 | ..1............................. | |
| 30 | .1.............................. | |
| 31 | 1............................... | |
| 32 | .....1..11......1...111.11.11.111 | |
| 33 | ....1..11......1...111.11.11.111. | |
| 34 | ...1..11......1...111.11.11.111.. | |
| 35 | ..1..11......1...111.11.11.111... | |
| 36 | .1..11......1...111.11.11.111.... | |
| 37 | 1..11......1...111.11.11.111..... | |
| 38 | ..11.1..1....11..111.....111.111 | |
| 39 | .11.1..1....11..111.....111.111. | |

FIG. 2

METHOD TO ENSURE DATA INTEGRITY IN A TELECOMMUNICATIONS NETWORK

FIELD OF THE INVENTION

This invention relates to telecommunications networks and more particularly to an improved method for ensuring data integrity in a fast packet switching network.

BACKGROUND OF THE INVENTION

In a digital transmission network, data from a large number of users are serially transmitted from one network node to another network node, up to their respective final destination. Due to the evolution of networks towards more and more complex mixings of sub-networks with heterogeneous architectures, it is clear that there is a future requirement to support distributed computing applications across high speed backbones that may be carrying LAN traffic, voice, video and traffic among channel-attached hosts and workstations. Perhaps the fundamental challenge for high speed networking is to minimize the processing time within each node in the network.

Packet switching is now commonly used to accommodate the bursty, multiprocess communication found in distributed computing environments. Packets are pieces of data produced by an originating user which are prefixed with headers containing routing information that identifies the originating and destination users. Small computers, called packet switches or nodes, are linked to form a network. Some of these nodes are called end nodes and provide user access to the network. Adapters circuit at each of the switching nodes adapt the packet signals for transmission or delivery to the transmission links and user applications, respectively. Each node examines each header and decides where to send the packet to move it closer to its final destination.

When messages are transmitted and received over telecommunication links, errors can occur because of many sources of noise, e.g., interference between channels, atmospheric conditions, etc.

A method is thus needed to detect when the message received is not the same as the message transmitted. Methods commonly used to detect errors include checksum, parity check, longitudinal redundancy code, and cyclic redundancy code.

In order to minimize the processing time within each node of a high speed network, the end-to-end recovery concept is now used as a result of the much better error rate of the new lines such as optical fiber.

The integrity of the message is ensured by the addition at the end of the message of a Frame Check Sequence (FCS) travelling with the message itself so it can be checked at far end for proper transmission. A Cyclic Redundancy Code (CRC) is employed to generate the FCS at one end and check the entire received message (data plus FCS) at the other end. This is the case of Frame Relay, for instance. Asynchronous Transfer Mode (ATM) even goes further, not only protecting either the entire message or each cell, but also all cell headers that carry routing information.

The standard circuitry for computing the FCS or checking the message is a Linear Feedback Shift Register (LFSR) which carries out a bit by bit multiplication in the Galois Field (GF), i.e., modulo the polynomial on which GF is generated. Each bit of the message is pushed in the LFSR; most significant bit (MSB) first. Division is performed by the feedbacks. At the end of the process, the FCS (the remainder of the division) is within the shift register. This method and type of circuitry is described, for instance, in "Error Correcting Codes" by Peterson and Weldon, The MIT Press, 2nd Edition, 1972. Yet this simple method suffers an obvious drawback since only one bit is processed at each shift while messages may be as long as 8 kBytes and, consequently, 64 k shifts needed. If a 32 bit CRC is used, a 32 position shift register is needed. Computing the CRC takes as many clock pulses as there are bits in the message. It is no longer acceptable in terms of run-time.

To expedite the calculation of the CRC, other methods have been proposed where computation is done on a byte basis. These methods (for example, the method described in "Teleinformatique 1", H. Nussbaumer, Presses Polytechniques Romandes, 1987; or in the article "Byte-wise CRC Calculations" by A. Perez et al., IEEE MICRO, June 1983, pages 40–46) have in common that they anticipate the result after eight shifts have occurred in the LFSR. They all use the same standard 16 bit polynomial $X^{16}+X^{12}+X^5+1$, and although much simpler than the 32 bit polynomial, they require the use of a 256×16 look up table and/or a complex hardware assist.

OBJECTS OF THE INVENTION

It is therefore a principal object of the invention to provide a method to ensure data integrity in a telecommunications network which is simpler and faster than those of the prior art.

It is another object of the invention to provide a method taking advantage of the properties of the Galois Fields.

BRIEF SUMMARY OF THE INVENTION

According to the invention, this object is accomplished by providing a method of generating and checking a Frame Check Sequence (FCS) for a message formed as a sequence of n-bit data bytes and inserting said FCS at the end of said message, comprising performing a computation operation on said sequence of data bytes in order to generate said FCS, characterized in that said computation operation comprises the following steps:

a. sequentially receiving said sequence of data bytes of said message;

b. pushing each byte of said data bytes sequence into register means, until said register means is full;

c. multiplying the content of said register means by a vector belonging to the Galois Field that matches the number of bits of said n-bit data byte processed at each step;

d. updating the content of said register means;

e. pushing a new byte of data in said register means;

f. repeating steps c, d, e until all the data bytes have been pushed into said register means.

BRIEF DESCRIPTION OF THE DRAWINGS

The invention will be described with respect to a preferred embodiment thereof, which is further shown in the drawings in which:

FIG. 2 is a table representing some vectors of the Galois Field generated by a polynomial of degree 32.

DETAILED DESCRIPTION OF A PREFERRED EMBODIMENT OF THE INVENTION

Figure 1:
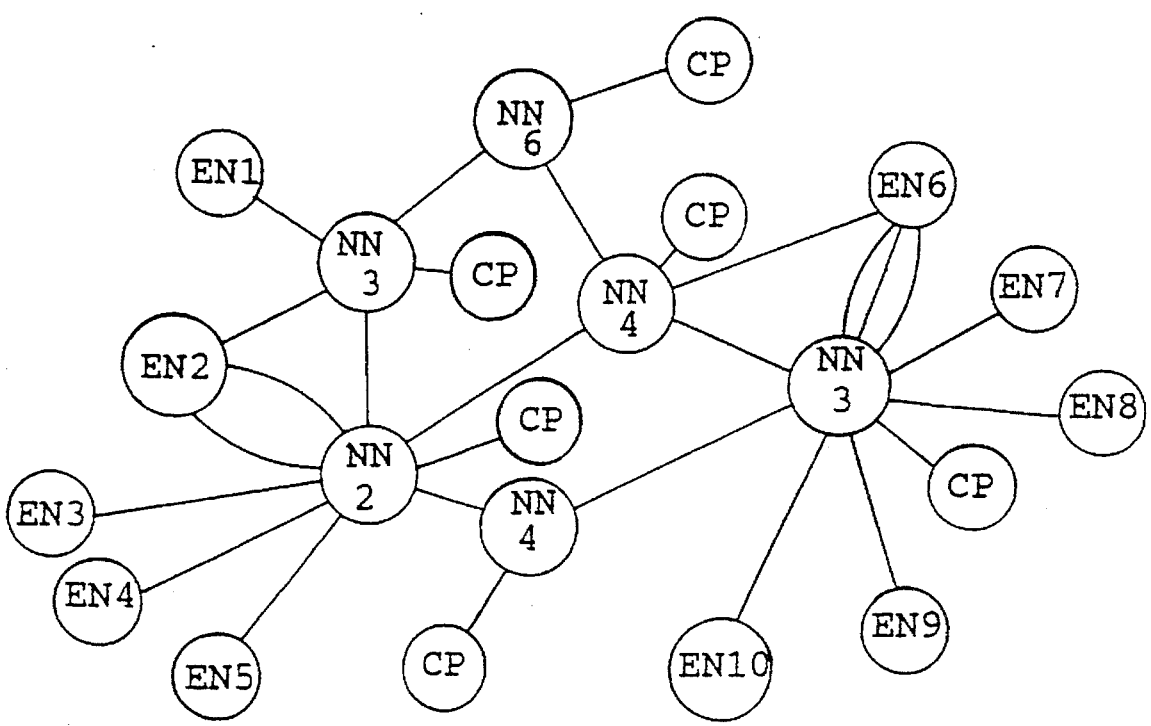
FIG. 1 is a block diagram representing a communications network within which the invention may be practiced.

FIG. 1 represents a packet-switching data network consisting of switching nodes and high speed transmission links between these nodes. Each of those nodes is linked to at least one other node through one or more communications links. Network nodes (NN1–NN6) are shown with attached end nodes (EN1–EN10). The switching nodes are data processing systems that provide certain communication services for their own end nodes or for other switching nodes. The communication services include, among other things, the selection and set up of communication routes between nodes, directory services and the maintenance of a network topology data base. These services are implemented in a Control Point (CP) which is associated with every switching node.

In any data communication network, data originating with a first end user is transferred to a second end user along a data path that may include many multiple network nodes and links. In many types of systems, extensive error detection is performed at each of the network nodes on the path. If an unrecoverable error is detected at the node, the data unit is discarded. In a packet switching system, on the other hand, only limited error checking is performed at the intermediate nodes. Extensive error checking is performed only at the destination node.

In a packet switching network, packets are pieces of data which are prefixed with headers containing routing information that identifies the originating and destination users. Each node examines each header and decides where to send the packet to move it closer to its destination.

As described above, the integrity of the message is ensured by the addition at the end of the message of a Frame Check Sequence (FCS). The FCS field appended at the end of a message or to the portion of a message that needs to be protected is the remainder of the division by a generator polynomial G(x) of the binary sequence of which the message is composed. The checking device must perform the same division. Since the remainder has been added at the source, the result of the division must be 0. Otherwise the message has been corrupted. Various polynomials are used depending on the protocol or mode of transmission considered (ATM, Frame Relay, SDLC, FDDI, Ethernet, etc.).

The method to get the CRC computed according to the invention will now be illustrated with a polynomial of degree 32 used, for instance, by FDDI and ATM.

$$G(x)=X^{32}+X^{26}+X^{23}+X^{22}+X^{16}+X^{12}+X^{11}+X^{10}+X^8+X^7+X^5+X^4+X^2+X^1+1$$

This polynomial can be seen as a 33 bit binary vector, where ones occupy the different powers of X in G(x). The binary form of G(x) is then:

B'100000100110000010001110110110111'

The theory of Cyclic Redundancy Codes (CRC) is based on Galois Fields (GF) where operations are done bit by bit modulo 2 on binary expressions like the one above. The addition is an XOR, and the multiplication, an AND logic operator. All operations on vectors do not return a vector wider than the power of the chosen polynomial (32 in our example). This is because all the operations on vectors are performed modulo G(x), i.e., divided by G(x) till no 1 remains at the left of the 32nd bit position. G(x) can then be used to generate a Galois Field. Because the chosen polynomial is irreducible (a list of irreducible polynomials can be found in the cited book by Peterson and Weldon), the finite number of elements of the field, which are noted $\alpha^N$, is $2^{32-1}$. Forty-eight elements of the field are shown in the table of FIG. 2.

Following holds in a Galois Field:

$\alpha^0$ the first vector of the field is the identity element of the multiplication $\alpha^0 \times \alpha^n = \alpha^n$ Multiplication is true modulo, the length of the field ($2^{32-1}$ or 4294967295).

$$\alpha^5 \times \alpha^8 = \alpha^{13}$$

$$\alpha^{4294967287} \times \alpha^8 = \alpha^0$$

and more generally $$\alpha^i \times \alpha^j = \alpha^{i+j \bmod 4294967295}.$$

In a recurring process where bytes are appended to form a complete message, assume one has been able to compute the FCS for the N bytes that have already been accumulated. Referring to the process shown in FIG. 3, it can be seen that if one needs to append eight more bits to the message, a corresponding shift must occur to leave room to the incoming byte. The current FCS, which is a vector G(x) of the Galois Field, must then be multiplied by $\alpha^8$ to take care of the shift. Obviously, multiplication must obey the rule to multiply in a GF and has to be performed modulo G(x). The Galois Field multiplier is described hereafter. However, by looking at the table of FIG. 2, one may notice that element $\alpha^8$ is a simple vector with a single 1. Now it must be noticed that the incoming byte is a vector narrower than G(x). Thus, the calculation of the remainder of the division by G(x) is a trivial operation. It is the vector itself and no division has to take place. Therefore, calculating the new FCS after a byte has been appended is straightforward:

$$FCS_{(N+1)} = FCS_{(N)} \times \alpha^8 + B_{(N+1)}$$

where $B_{(N+1)}$ is the incoming byte.

Figure 4:
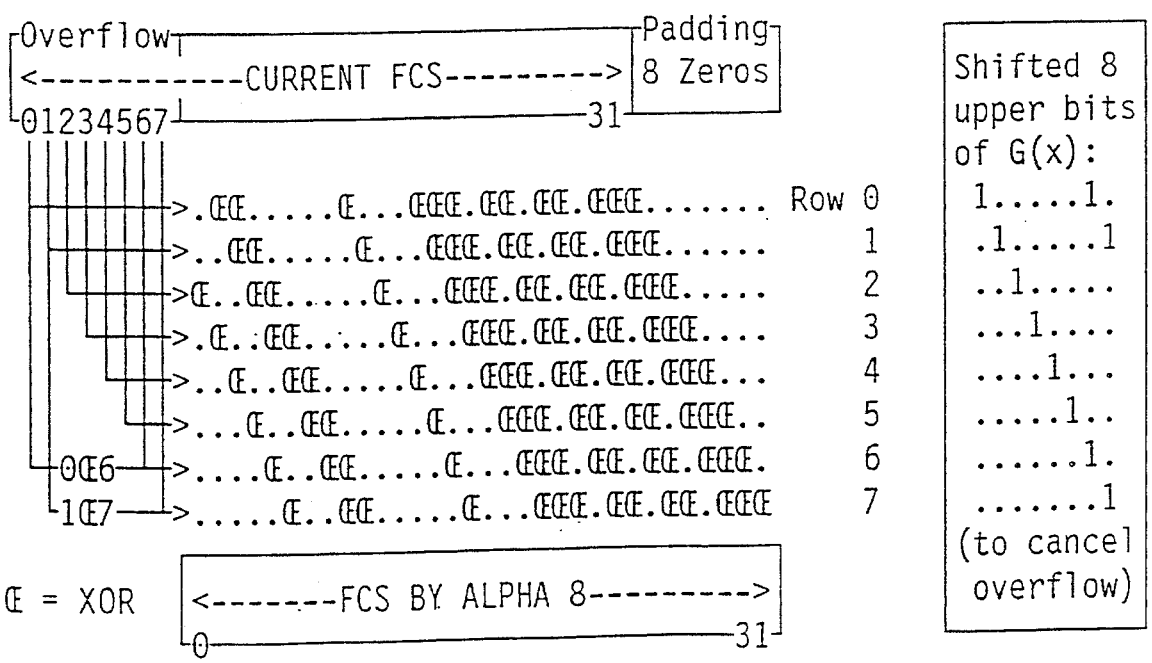
FIG. 4 is a detailed representation of the Galois Field Multiplier of FIG. 3.

Referring now to FIG. 4, there is shown a Galois Field multiplier. A Galois Field multiplier by $\alpha^8$ is a simple combinatorial device. Multiplication by itself consists in padding 8 zeros to the right of the multiplicand (the current FCS) since $\alpha^8$ is a simple vector with a single 1 in the 9th bit position. Now, up to 8 ones, that have been pushed at the left of the 32nd bit position by the padding, must be cancelled by adding (subtracting) G(x) so that the result should not be greater than 32 bits. This is a process comparable to the one performed by hand when dividing ordinary numbers.

Although the polynomial G(x) used to implement CRC computation is of degree 32, the multiplication requires only 110 two-input XOR operators OE (plus 8 for adding the incoming byte) and the result is available after having gone thru 6 XOR's. The number of XOR operators is directly dependent on the number of 1's in the chosen polynomial. Other polynomials, such as those used in the standard methods, having generally just a couple of 1's, thus greatly reducing the number of XOR's needed, would require many more operators and the number of layers used would delay the result.

Figure 3:
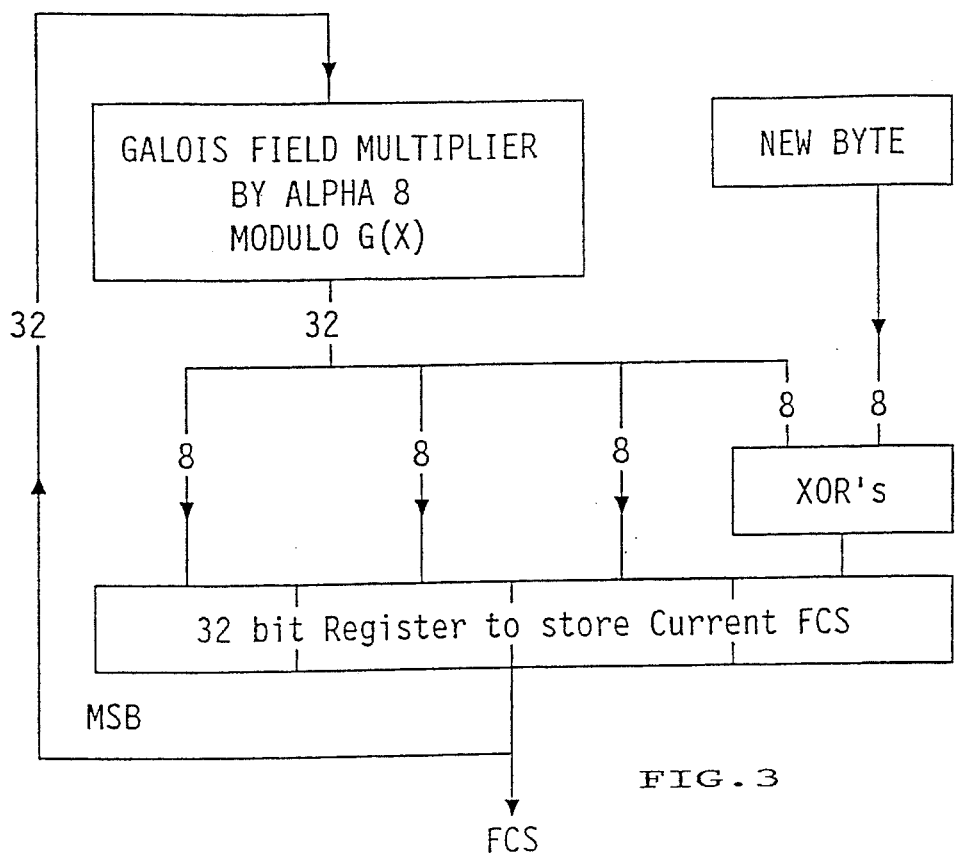
FIG. 3 is a block representation of the process used to calculate the new FCS.
Figure 5:
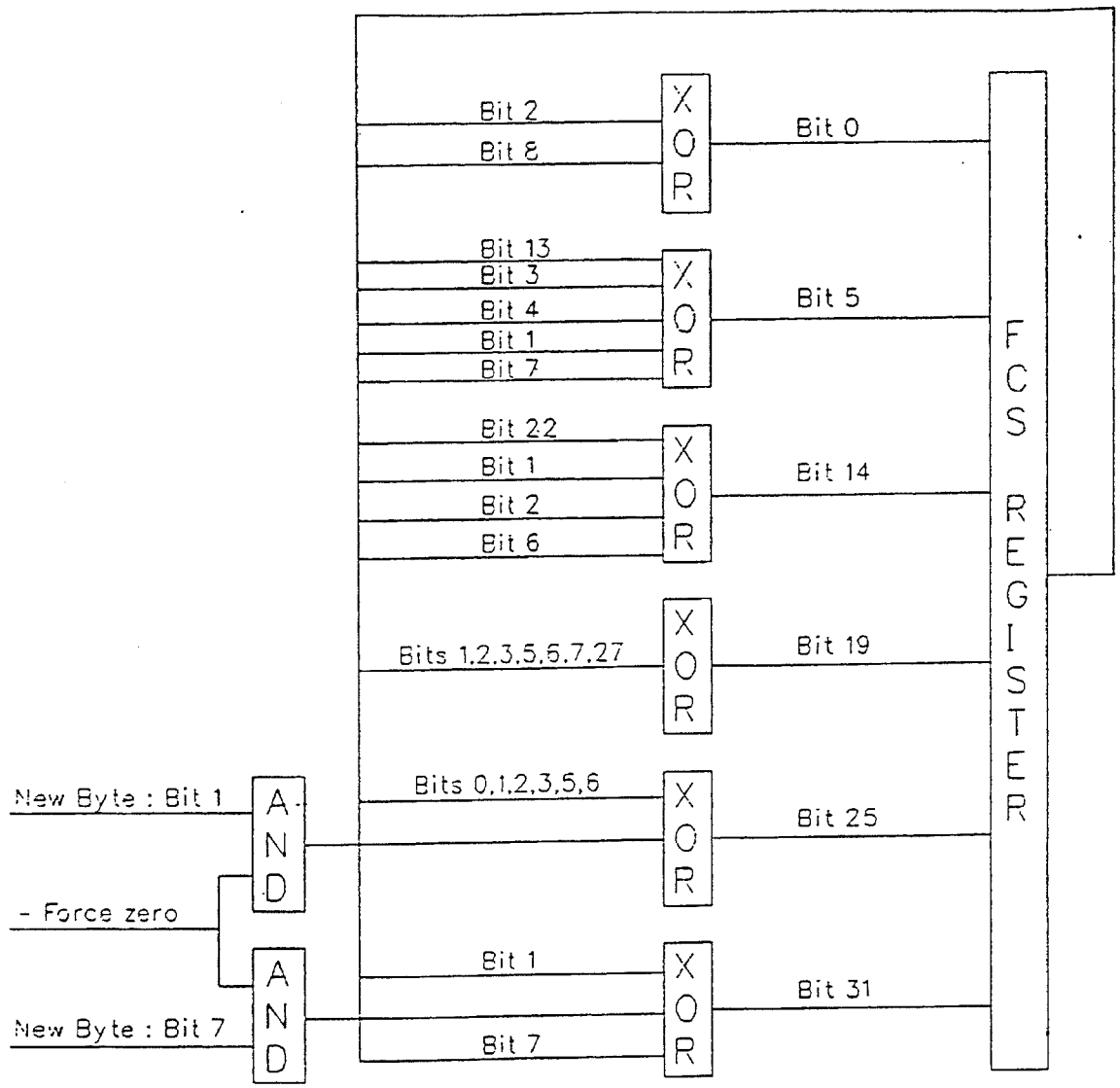
FIG. 5 is a block diagram of the logic of the Galois Field Multiplier represented at FIG. 4.

In the matrix of XOR's shown in FIG. 4, the rows 0 to 7 that must be added to the shifted current FCS are the ones where there is a 1 to erase in the overflow field, except for rows 6 and 7, where the enabling is the XOR of data bits in position 0,6 and 1,7, respectively. This is because more than a single 1 appears in the first 8 bits of G(x). Finally, since CRC assumes a pre-multiplication of the data by the degree of the polynomial when the last byte is received, four extra cycles have to be executed while 0's are pushed as data to finish computation of the FCS. This corresponds to an extra multiplication by $\alpha^{32}$ or four times by $\alpha^8$. FIG. 5 shows a particular implementation of the circuitry used to practice the method of the invention. The matrix of XOR's that perform the multiplication by $\alpha^8$ and the 32 bit FCS register of FIG. 4 and the XOR's used to add the new byte of FIG. 3 are shown. Only the logic of bits 0, 5, 14, 19, 25 and 31 have been represented. The logic for the other bits can easily be derived. It should be obvious at reading that the simple process described here to calculate the CRC can be adapted to any polynomial on which a Galois Field can be generated. The number of bits processed at each cycle can be different from 8, providing it stays below the degree of the polynomial to keep multiplication simple using the first elements of any GF that are single one vectors (i.e, up to $\alpha^{31}$ in the example of this invention). The multiplier has as many rows as the number of bits appended to the message at each cycle, and the number of XOR's in the matrix is a direct function of the number of rows and of the number of 1's in the polynomial. Processing 32 bits to implement a 4 byte-wise CRC at each step would require a multiplier by $\alpha^{32}$. Because $\alpha^{32}$ is the first element of the field, having more than a single 1 multiplier would be more complex to implement, yet still very feasible while the other methods of the prior art would have practical limitations, such as the size of the look-up tables (232 entries).

To improve error detection at the receiver end, the various existing standards have brought modifications to the CRC computation. When calculated on a bit basis, the shift register that houses the FCS is assumed to be preset to all ones before generation or checking start and once calculated, the FCS is sent inverted. To take account of this requirement, according to the invention, the register must be preset with a pattern which is not all one's but rather:

B '01000110101011110110010001001001'

This preset pattern is the GF element which once multiplied by $\alpha^{32}$ yields the all one pattern. This is made necessary because of the few extra cycles required by the method of the invention to have the FCS computed.

When checked at far end, the register must be preset with the same GF element. After the whole message (data and FCS inverted) has been passed through the GF multiplier (with no extra cycles this time), the register must contain the all one vector if no error has occurred. In the standard method, the expected register contents is checked against a special pattern which is the result of the division of the all one pattern by G(x).

Figure 6:
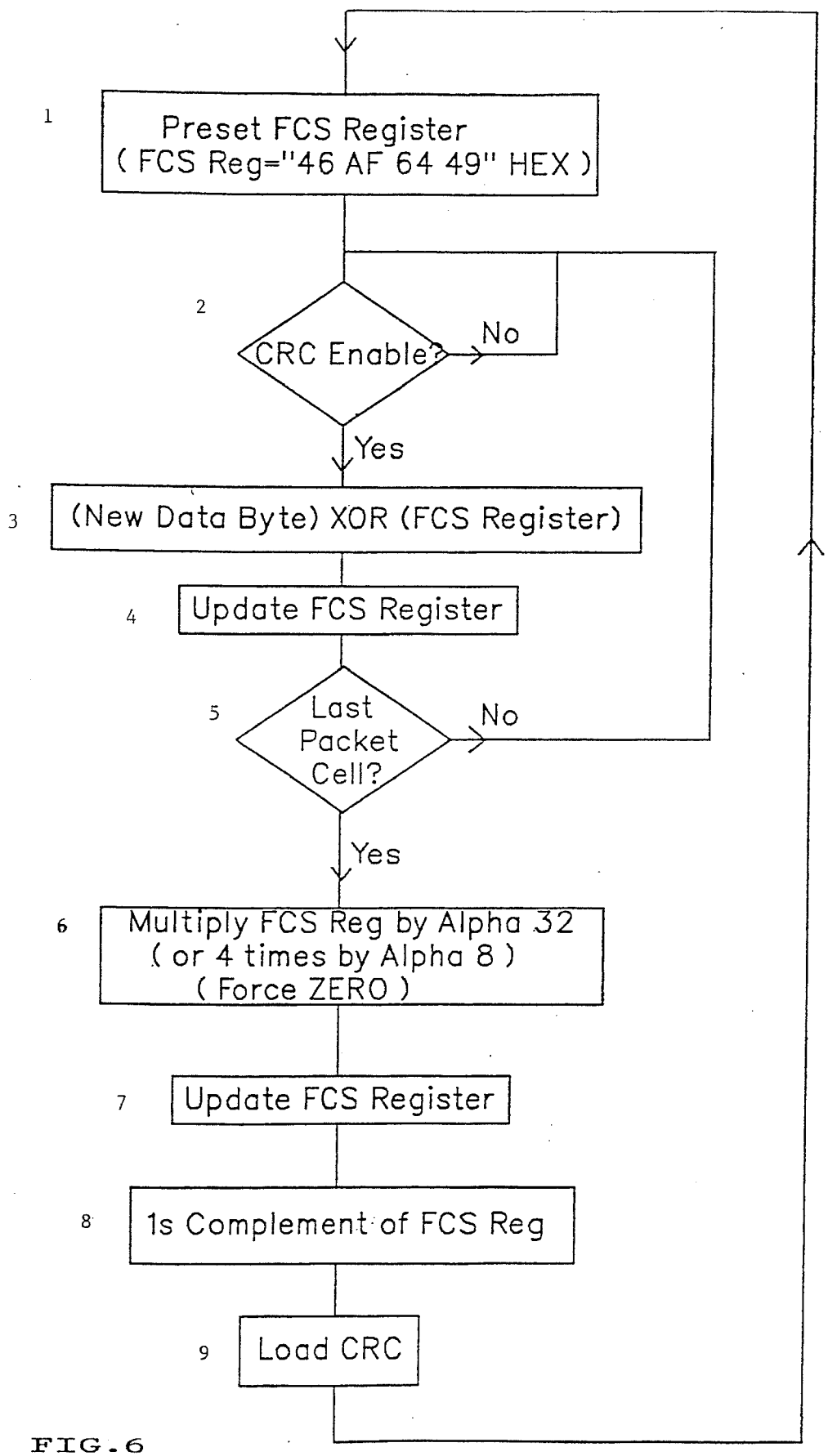
FIG. 6 is a flow diagram of the method of the invention.

FIG. 6 is a flow diagram of the method of the invention. At step 1, the FCS register is preset to all ones ('FFFFFFFF' HEX), as explained before. In the preferred embodiment of the invention, the FCS register is preset to '46AF6449' HEX, which value when multiplied by $\alpha^{32}$, gives 'FFFFFFFF' HEX. At step 2, the CRC calculation is enabled for data bytes and may be disabled if necessary. At step 3, the FCS is calculated and at step 4, the FCS register is updated. At step 5, if the cell is the last cell of the packet of data, the new FCS is calculated in step 6, and the FCS register is updated in step 7. At the last step, the ones complement of the result is inserted at the end of the last cell as the 32 bit CRC and transmitted.

Figure 7:
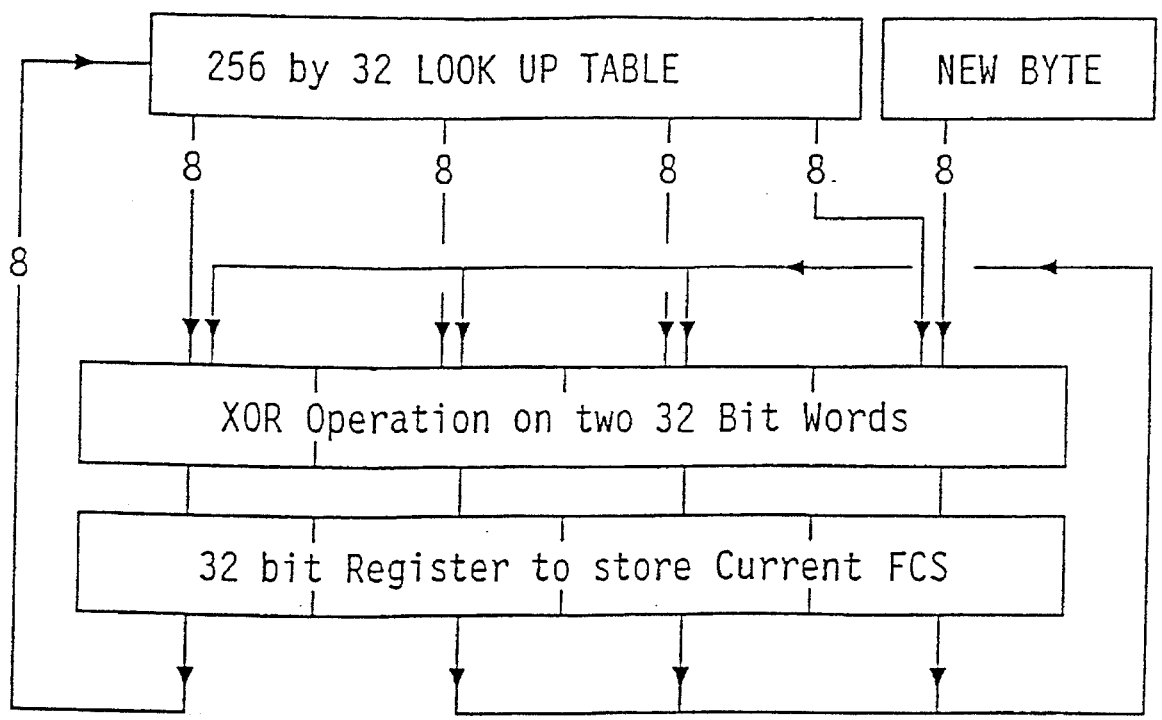
FIG. 7 is a block representation of the process used to calculate the new CRC implemented in software.

The process for computing the CRC described above can be implemented in software as well. It results in a very simple algorithm with a single look-up table consultation plus a single XOR operation on the full CRC. This is shown in FIG. 7. The number of loops to be performed is the number of bytes of the message plus 4 for the 32-bit CRC used in the method of this invention.

We claim:

1. A method for generating and checking a Frame Check Sequence (FCS) for a message formed as a sequence of n-bit data bytes and inserting said FCS at the end of said message, comprising performing a computation operation on said sequence of data bytes in order to generate said FCS by processing each of said n-bit data bytes, in successive cycles, characterized in that said computation operation comprises the following steps:

a. sequentially receiving said sequence of n-bit data bytes of said message;

b. pushing each data byte of said sequence of n-bit data bytes into a shift register, until said shift register is full;

c. multiplying the contents of said shift register at each cycle by a vector belonging to the Galois Field that matches the number of bits of said n-bit data byte processed at each cycle;

d. updating the contents of said shift register by loading the result of said multiplying step into said shift register;

e. pushing a new byte of data from said sequence of n-bit data bytes into said shift register;

f. repeating steps c, d, e until all the n-bit data bytes from said sequence of n-bit data bytes have been pushed into said shift register.

2. The method according to claim 1 wherein each data byte in comprised of 8 bits and said vector belonging to said Galois Field is $\alpha^8$.

3. The method according to claim 2 wherein the step of multiplying the contents of said shift register by $\alpha^8$ consists in padding 8 zeros to the contents of said shift register.

4. The method according to claim 3 further comprising the step of discarding the bits having been pushed out of said shift register by said padding to the contents of said shift register.

5. The method according to any one of claims 1–4 wherein, at initialization the content of said shift register is preset to all ones.

6. The method according to claim 5 wherein the FCS once calculated is sent inverted.

7. An apparatus for generating and checking a Frame Check Sequence (FCS) for a message formed as a sequence of n-bit data bytes and inserting said FCS at the end of said message wherein the n-bit data bytes of said message are sequentially received and a computation operation on said sequence of n-bit data bytes is performed in successive cycles in order to generate said FCS, said apparatus comprising:

- a shift register having a number of positions equal to the number of bits in said FCS and into which each n-bit data byte of said sequence of n-bit data bytes is pushed until said shift register is full;
- a Galois Field multiplier activated at each cycle to multiply the contents of said shift register by a vector of the Galois Field;
- gating circuitry to load said shift register with the result of said Galois Field multiplication; and
- means for pushing a new n-bit data byte of said sequence of n-bit data bytes into said shift register with said shift register containing a current FCS at each cycle.

8. The apparatus according to claim 7 wherein said Galois Field multiplier is a matrix of XOR operators.

* * * * *